(12) United States Patent
Greene

(10) Patent No.: US 8,118,982 B2
(45) Date of Patent: Feb. 21, 2012

(54) GAS FLOW SET-UP FOR MULTIPLE, INTERACTING REACTIVE SPUTTER SOURCES

(75) Inventor: Philip A. Greene, Oakland, CA (US)

(73) Assignee: Applied Materials, Inc., Santa Clara, CA (US)

( * ) Notice: Subject to any disclaimer, the term of this patent is extended or adjusted under 35 U.S.C. 154(b) by 538 days.

(21) Appl. No.: 12/399,814

(22) Filed: Mar. 6, 2009

(65) Prior Publication Data

US 2010/0224481 A1 Sep. 9, 2010

(51) Int. Cl.
*C23C 14/32* (2006.01)
*C23C 14/00* (2006.01)
(52) U.S. Cl. .................... 204/192.13; 137/14
(58) Field of Classification Search ............. 204/192.13; 137/14
See application file for complete search history.

(56) References Cited

U.S. PATENT DOCUMENTS 6,143,080 A 11/2000 Bartholomew et al.
6,210,745 B1 4/2001 Gaughan et al.

FOREIGN PATENT DOCUMENTS

JP 01183112 A 7/1989

OTHER PUBLICATIONS

Gonzalez et al. (Long Term Process Control and Stability in Reactive Sputtering, 48th Annual Technical Conference Proceedings (2005) ISSN 0737-5921).*
Nadel et al. (Equipment, Materials and processes: a review of high rate sputtering technology for glass coating, Thin Solid Films 442 (2003) 11-14).*
International Search Report and Written Opinion of the International Searching Authority mailed Sep. 27, 2010 in PCT/US2010/026199.

* cited by examiner

*Primary Examiner* — Keith Hendricks
*Assistant Examiner* — Ibrahime A Abraham
(74) *Attorney, Agent, or Firm* — Patterson & Sheridan, L.L.P.

(57) ABSTRACT

A method and apparatus for physical vapor deposition of films on a substrate is provided. The apparatus comprises a series of connected sputtering chambers through which a substrate passes to undergo sequential deposition processes. The chambers have passages through which the substrates move, and through which process gases may leak. Target gas flows to each chamber are established by operating each chamber while adjacent chambers are idle, measuring the extent of gas communication between the chambers, and reducing the flows by an amount based on the extent of gas leakage.

4 Claims, 4 Drawing Sheets

GAS FLOW SET-UP FOR MULTIPLE, INTERACTING REACTIVE SPUTTER SOURCES

FIELD

Embodiments of the invention relate to methods and apparatus for processing glass or semiconductor substrates. More specifically, embodiments relate to methods and apparatus for performing physical vapor deposition (PVD).

BACKGROUND

Physical vapor deposition is a process used widely in film coating applications. A substrate is positioned in an apparatus having a component made of the material to be deposited onto the substrate disposed therein. The component is usually coupled to an electrode in some way to enable establishing an electric field around the target component. The electric field is used to ionize a gas in the vicinity of the target component and accelerate the ions toward the target, and magnets are used to confine electrons to an area near the target so they can further ionize gas atoms before they flow to an electrode or to the chamber wall. Ion collisions with the target dislodge material from the target, and the material falls onto the substrate, forming a film coating thereon.

In some manufacturing processes, multiple films are deposited on one substrate. In some cases, more than one film may be deposited in a single chamber, but in most cases, multiple chambers are used in sequential deposition processes. When depositing thin films, thickness uniformity across the film is desired, and many measures are used to adjust deposition uniformity across a substrate. In multi-chamber processes, defects in uniformity from chamber to chamber must also be managed. In some processes, chambers that are physically connected to facilitate transport of substrates between them can also give rise to operational interactions between the chambers that can adversely affect deposition rate and uniformity. Thus, there is a continuing need for methods of operating connected process chambers in ways that promote uniform deposition.

SUMMARY

Embodiments of the invention provide a method of operating a line of connected sputtering chambers, comprising measuring gas isolation for each chamber in the line, measuring getter pumping flow for each chamber in the line, setting inert gas flow to each chamber based on its measured gas isolation, and setting reactive gas flow to each chamber based on its measured gas isolation and getter pumping flow.

Other embodiments provide a method of depositing material on a substrate in a plurality of sputtering chambers connected in a linear configuration, comprising determining target gas flow rates for each chamber operated independently, measuring gas leakage between the chambers, measuring getter pumping of each chamber, and setting gas flow rates to each chamber based on the target gas flow rates for each chamber operated independently, gas leakage between the chambers, and getter pumping of each chamber.

Other embodiments provide a method of operating a line of connected sputtering chambers, comprising operating each chamber in the line with adjacent chambers idle but evacuated, providing process gas to the operating chamber, determining a gas isolation factor by measuring a pressure in the operating chamber and comparing it to a pressure in at least one adjacent chamber, and adjusting gas flow to the operating chamber based on the gas isolation factor.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention provide methods of operating physical vapor deposition (PVD) chambers in a connected train. In typical embodiments, a plurality of PVD chambers are connected in a train, which may be linear in configuration, and substrates move through the plurality of chambers on a moveable support. A substrate moves into a chamber through a passage in one side of the chamber, moves into a processing region of the chamber, is processed, and moves out of the chamber through a passage in the opposite side of the chamber. In a linear configuration, the substrate moves from chamber to chamber this way for processing. In each chamber, a PVD or sputtering process may take place. Process gases are provided to the chamber, and one or more sputtering targets disposed in the chamber are powered to energize the sputtering process. Material sputtered from the targets rains down on the substrate to form a film. Gas is evacuated from the chamber by a vacuum portal, and by communication with other chambers through the passages. Reactive gases in the process gas mixture are also consumed by being deposited on the substrate or the chamber walls.

When operating a train of chambers concurrently, it is usually desired that gas flow rates be set at target values to achieve desired deposition rates and uniformities. Proper gas flow rates are necessary to maintain target pressures and partial pressures in the chambers so that the plasma has the desired density and geometry. Gas leakage out of a chamber acts as an outflow, tending to reduce pressure; gettering, removal of reactive gases from the gas mixture during deposition, also reduces pressure. Gettering may occur through consumption of gas by the sputtering process, such as in reactive sputtering, or by adsorption onto chamber surfaces. One or more sensors, such as a flow sensor, a pressure sensor, or a sensor for both pressure and flow, can be used to sense the gas leakage among chambers, and a flow controller may be used to adjust gas flows to each chamber based on the sensor measurements.

Figure 1:
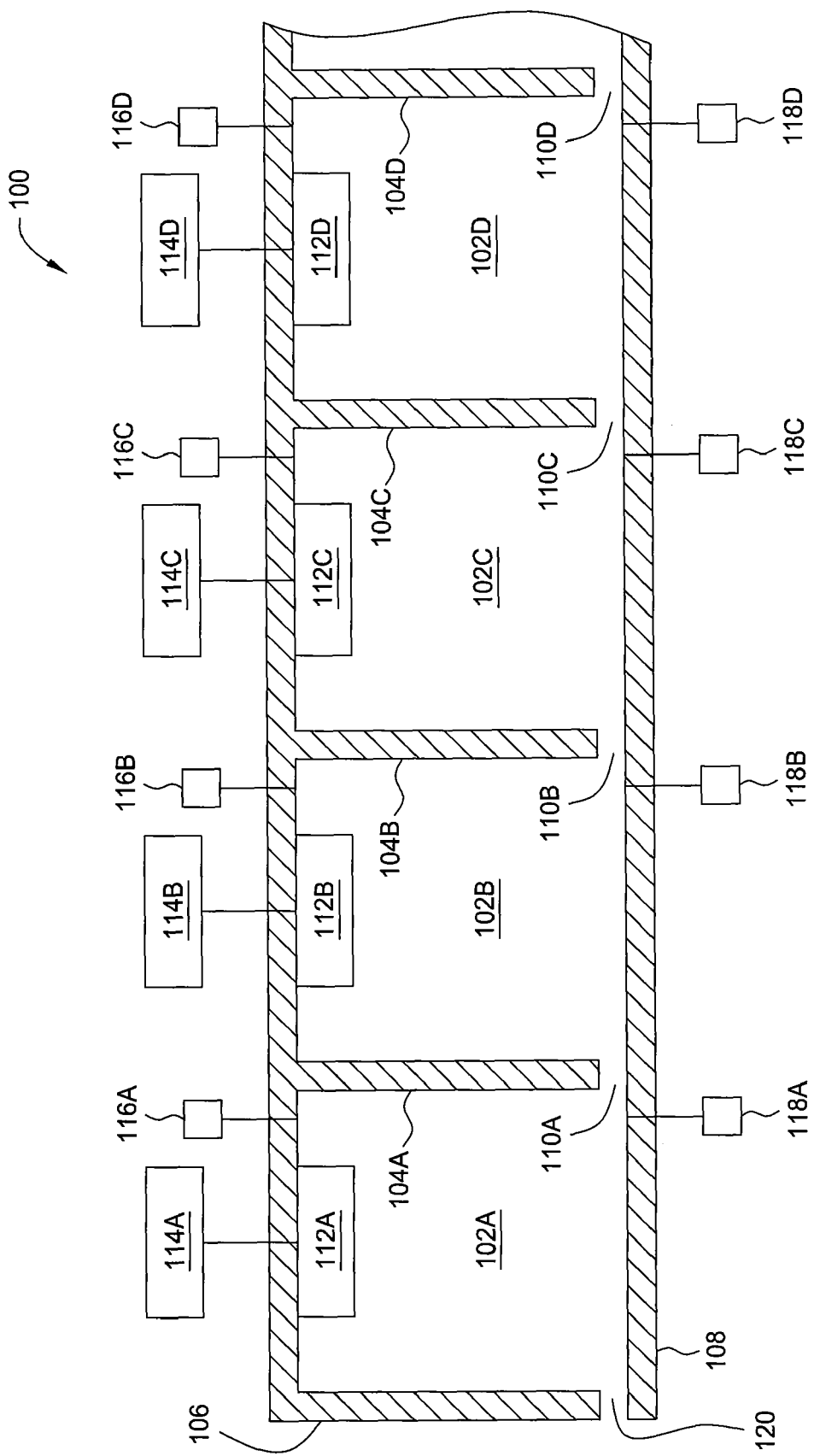
FIG. 1 is a schematic side view of an apparatus for forming thin films on substrates by a physical vapor deposition process according to one embodiment of the invention.

FIG. 1 is a schematic side view of an apparatus 100 for forming thin films on substrates by a physical vapor deposition process according to one embodiment of the invention. For purposes of simplicity, only a portion of the apparatus 100 is shown in FIG. 1. The apparatus 100 comprises a plurality of PVD chambers 102A-D connected in a linear configuration. The chambers are separated by walls 104A-D, and the apparatus 100 is enclosed by an outer wall 106. A substrate support surface 108 underlies the apparatus 100, and supports substrates disposed in the apparatus 100. The substrate support surface 108 may comprise a transportation means (not shown), such as a conveyor, for moving substrates into, through, and out of the apparatus 100. The walls 104A-D separating the chambers 102A-D have openings 110A-D to admit substrates from one chamber to another. In some embodiments, one or more of the walls 104A-D may be partly or completely replaced by gas curtains, which may be formed by providing nozzles in the wall or roof of the apparatus for flowing gas toward the surface 108.

Each chamber 102A-D has a sputtering target or target assembly 112A-D powered by a power source 114A-D. An electrode (not shown) may be disposed in each chamber 102A-D to provide a capacitative terminal for generating an electric field between the targets 112A-D and the electrodes. Alternately, the electric field may permeate the chamber, with power applied only to the targets 112A-D. Process gas may be provided to each chamber 102A-D from gas sources 116A-D. The gas sources are illustrated here as separate elements, but may be pathways through which gas flow can be independently adjusted using valves, the pathways deriving process gas from one or more central gas sources. For example, each process gas to be provided to any chamber may be sourced from a single vessel through a piping manifold to each chamber 102A-D, with flow control valves controlling gas flow rates to each chamber 102A-D. Gas is removed from each chamber by vacuum sources 118A-D. In this embodiment, one vacuum source is shown for each chamber, but in other embodiments two adjacent chambers may share a vacuum source.

In operation, a substrate may enter the apparatus 100 through an opening 120 and rest on the surface 108. If the surface 108 comprises a moving surface, such as a transport means, for example a conveyor, the substrate is drawn into the first chamber 102A by movement of the conveyor. Process gas is provided to the chamber from gas source 116A, and may comprise a non-reactive sputtering gas and a reactive sputtering gas. Non-reactive sputtering gases typically include argon or helium, or both, and reactive sputtering gases may comprise any gas containing elements desirous of deposition onto the substrate, such as oxygen gas, nitrogen gas, or a carbon- or hydrogen-containing gas. In addition to elemental gases, compounds such as ammonia may be useful reactive sputtering gases.

Power is applied from power source 114A to target assembly 112A to generate an electric field inside the processing chamber 102A. The electric field may range in strength from about 200 V to about 1,000 V, and may be applied as DC or AC power at levels ranging from about 1 kW to about 180 kW. AC frequency may range from about 10 kHz to about 300 kHz, typically between about 20 kHz and about 80 kHz, and commonly between about 30 kHz and about 40 kHz. The electric field ionizes the sputtering gas into a plasma and accelerates the ions toward the target, and magnets disposed in and around the target assembly 112A confine electrons to an area near the target to increase ionization of gas atoms. Ion collisions with the target dislodge material from the target, which falls onto the substrate disposed on the surface 108 below. If a reactive gas is included in the chamber, the dislodged material will react with the gas as it travels toward the substrate or after depositing on the substrate, depending on process conditions, removing the reactive gas from the process gas mixture. Additionally, some gas escapes through the opening 110A leading to the next chamber.

Interactions between gas flows in adjacent chambers can cause pressure fluctuations and disturbances that disrupt uniform plasma coverage and deposition on the substrate. For example, when power is applied to a target in a chamber performing a reactive sputtering process, pressure falls in the chamber because reactive gas species are removed from the gas by the reactive sputtering process. This lowered pressure induces or increases gas flow from adjacent chambers, causing a disruption to the deposition profile in those chambers.

Figure 2:
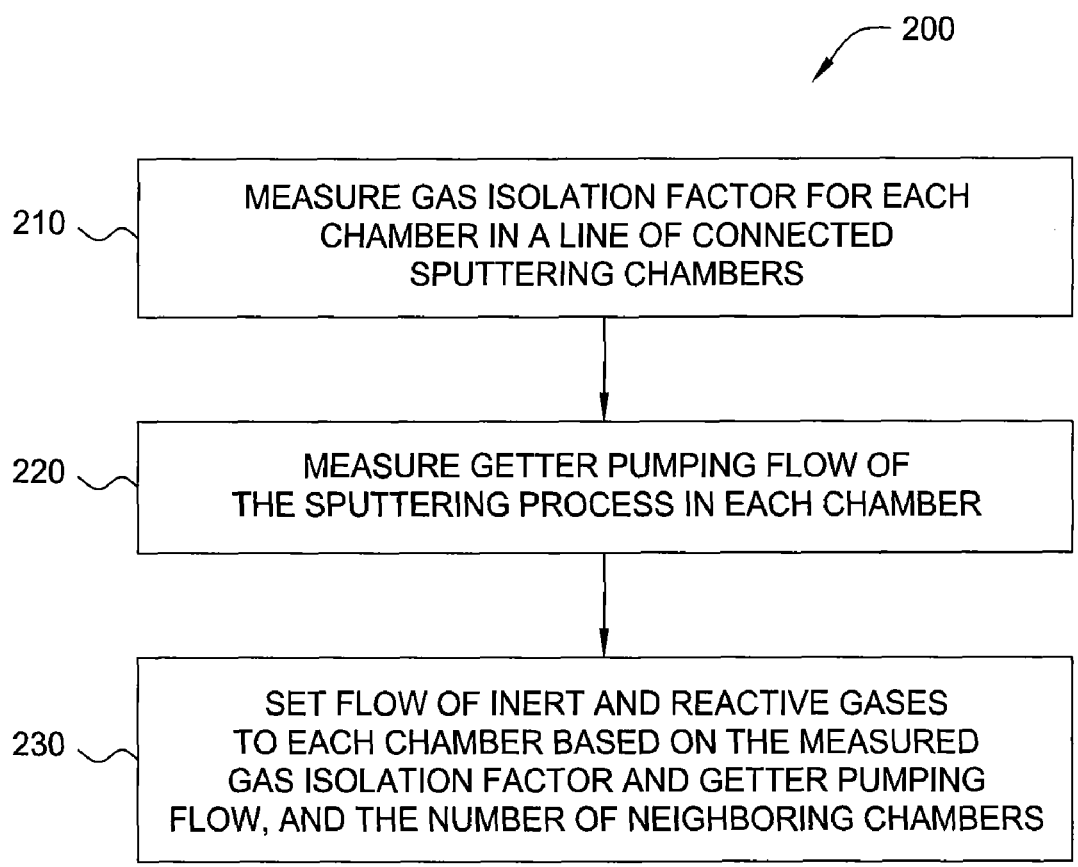
FIG. 2 is a flow diagram summarizing a method of operating a physical vapor deposition apparatus according to another embodiment.

FIG. 2 is a flow diagram summarizing a method 200 according to an embodiment of the invention. The method 200 facilitates setting target rates for gas flows in one chamber based on operating conditions in adjacent chambers in a line of connected PVD chambers. At 210, a gas isolation factor is measured for each chamber in the line. The gas isolation factor indicates the extent to which gas leaks from one chamber to adjacent chambers. In one embodiment, gas isolation may be measured by directly measuring the flow of gas from one chamber to an adjacent chamber, such as by providing a gas flow sensor in the openings between the chambers. In another embodiment, gas isolation may be measured by comparing pressures in the chamber to which gas is provided with pressures in adjacent chambers. In such an embodiment, process gas is provided to a single chamber in a line of connected chambers. A first pressure is measured in the chamber to which the process gas is provided, and a second pressure is measured in one or two adjacent chambers. The gas isolation factor may then be defined as a ratio of the first pressure to the second pressure. A higher gas isolation factor indicates a higher degree of isolation from adjacent chambers. Defined in this way, as the gas isolation factor approaches unity, isolation effectively disappears.

At 220, getter pumping of the sputtering process is measured. Getter pumping arises from reactive sputtering, wherein reactive species in the sputtering gas are removed from the gas by deposition onto the substrate and chamber components. Getter pumping of reactive gases onto chamber components may be measured by providing process gas to the chamber and briefly powering the target assembly. As reactive gases are removed by the sputtering process, the pressure fall in the chamber may be measured. A first pressure may be measured when power is applied to the target, and a second pressure when power to the target is interrupted. The getter pumping flow rate for the chamber will be total gas flow rate to the chamber multiplied by the fractional pressure drop when power is applied to the target assembly.

At 230, target gas flow rates may be set for each chamber accounting for gas isolation and getter pumping. In general, if a first target gas flow is established operating a single chamber at target deposition rate and uniformity, a second target may be devised by reducing the first target according to the gas isolation and getter pumping of the chamber. In one embodiment, inert gas flow to the chamber is reduced by an amount inversely proportional to the gas isolation factor defined above. In one embodiment the reduction will be approximately 0.5 divided by the gas isolation factor and multiplied by the number of adjacent chambers. In another embodiment, reactive gas flow to the chamber above that needed to replace getter pumping flow is modified in a similar fashion. Thus, in one embodiment the margin of reactive gas flow provided to the chamber above the getter pumping rate is reduced by an amount inversely proportional to the gas isolation factor. In another embodiment, the reduction of reactive gas above the getter pumping rate is approximately 0.5 divided by the gas isolation factor and multiplied by the number of adjacent chambers.

Gas isolation may be measured, and gas leakage accounted for, in other ways. In one embodiment, substantially equal gas flows may be established in a first and second chamber adjacent to each other. The gas flow may then be stopped to the first chamber, and the pressure drop measured in the second chamber. The gas leakage into the second chamber is proportional to the original flow in the first chamber times the percent pressure drop in the second chamber. The target inert gas flow to the second chamber may thus be reduced by a percentage equal to the percent pressure drop in the second chamber, and the margin of target reactive gas flow over getter pumping in the second chamber may be reduced by the same percentage. If there are two chambers adjacent to the second chamber, the percent reduction in gas flows is double the percent pressure drop measured in the second chamber.

In another embodiment, the first and second chambers may be established with substantially equal fixed gas flows and put on pressure control such that the gas flow to each chamber is adjusted to maintain a target pressure in that chamber. The flow is then stopped to the first chamber, and the control system is allowed to return pressure in the second chamber to target. The extra gas flow required to return the pressure in the second chamber to target is the gas leakage from the first chamber to the second chamber. Target inert gas flow to the second chamber may be reduce by the percent flow gain to the second chamber, and target reactive gas flow above the getter pumping rate may be reduced by the same percentage.

Figure 3:
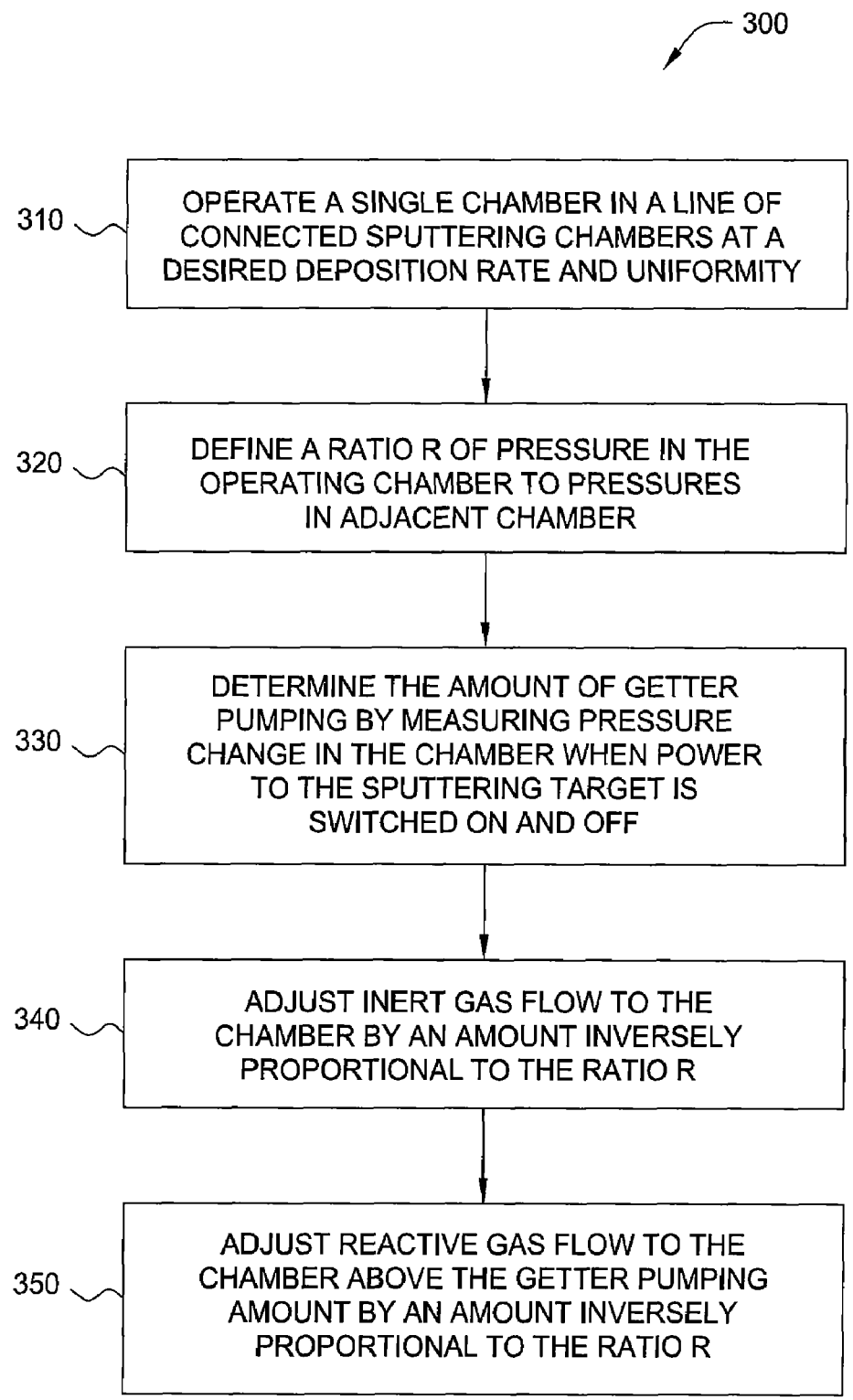
FIG. 3 is a flow diagram summarizing a method of operating a physical vapor deposition apparatus according to another embodiment.

FIG. 3 is a flow diagram summarizing a method 300 according to another embodiment of the invention. At 310, a first chamber in a line of connected sputtering chambers is operated to achieve target deposition rate and uniformity. Chambers adjacent to the first chamber are evacuated, but are kept idle in order to determine the operating characteristics of the first chamber. Process gas is provided to the first chamber, and power is applied to the target assembly of the first chamber. Deposition rate and uniformity are generally measured, and conditions adjusted in the first chamber to bring rate and uniformity to target.

At 320, the pressure in the first chamber is measured, and the pressure in one or both adjacent chambers is measured. If the pressure in both adjacent chambers is measured, an average is computed for the adjacent chamber pressure. A ratio R is defined as the pressure in the first chamber divided by the adjacent chamber pressure. This ratio indicates the extent to which gases leak from the first chamber to one or both adjacent chambers.

At 330, the power to the target assembly of the first chamber is switched on and off, and the pressure change recorded. From the pressure change, the amount of getter pumping due to deposition of reactive species on the substrate and on chamber components can be determined. A portion of the gas that is not deposited on a surface in the first chamber may communicate with adjacent chambers, according to the ratio defined in 320. In most embodiments, the getter pumping rate may be defined as the total gas flow multiplied by the fractional decrease in pressure when power is applied to the target assembly.

At 340, the flow of inert gas to the first chamber is adjusted by an amount inversely proportional to the ratio R. In some embodiments, the inert gas flow may be reduced when the first chamber is operated with adjacent chambers because gas leaks from the adjacent chamber into the first chamber. When the adjacent chamber is not operated, gas leakage is one way, from the first chamber to the adjacent chamber. When the adjacent chamber is operated with the first chamber, gas leakage flows in both directions, increasing back pressure in the first chamber. In some embodiments, the gas flow is reduced by an amount proportional to the number of adjacent chambers. In one embodiment, the reduction in inert gas flow to the first chamber is 0.5 times the number of operating adjacent chambers divided by the ratio R.

At 350, the flow of reactive gas to the first chamber is adjusted to account for getter pumping and leakage into adjacent chambers. Reactive gases that are not deposited on a surface in the first chamber may leak into adjacent idle chambers along with inert gas. When one or more of the adjacent chambers is operated with the first chamber, the gas leakage flow from the adjacent chamber to the first chamber increases pressure in the first chamber. Thus, in some embodiments, the flow of reactive gas to the first chamber must be reduced when operated simultaneously with adjacent chambers. In some embodiments, the amount of reactive gas flow to the first chamber above the getter pumping amount is reduced by an amount inversely proportional to the ratio R. In some embodiments, the reduction in reactive gas flow above the getter pumping amount is reduced by an amount proportional to the number of operating adjacent chambers. In some embodiments, the reduction is 0.5 times the number of operating adjacent chambers divided by the ratio R.

Figure 4:
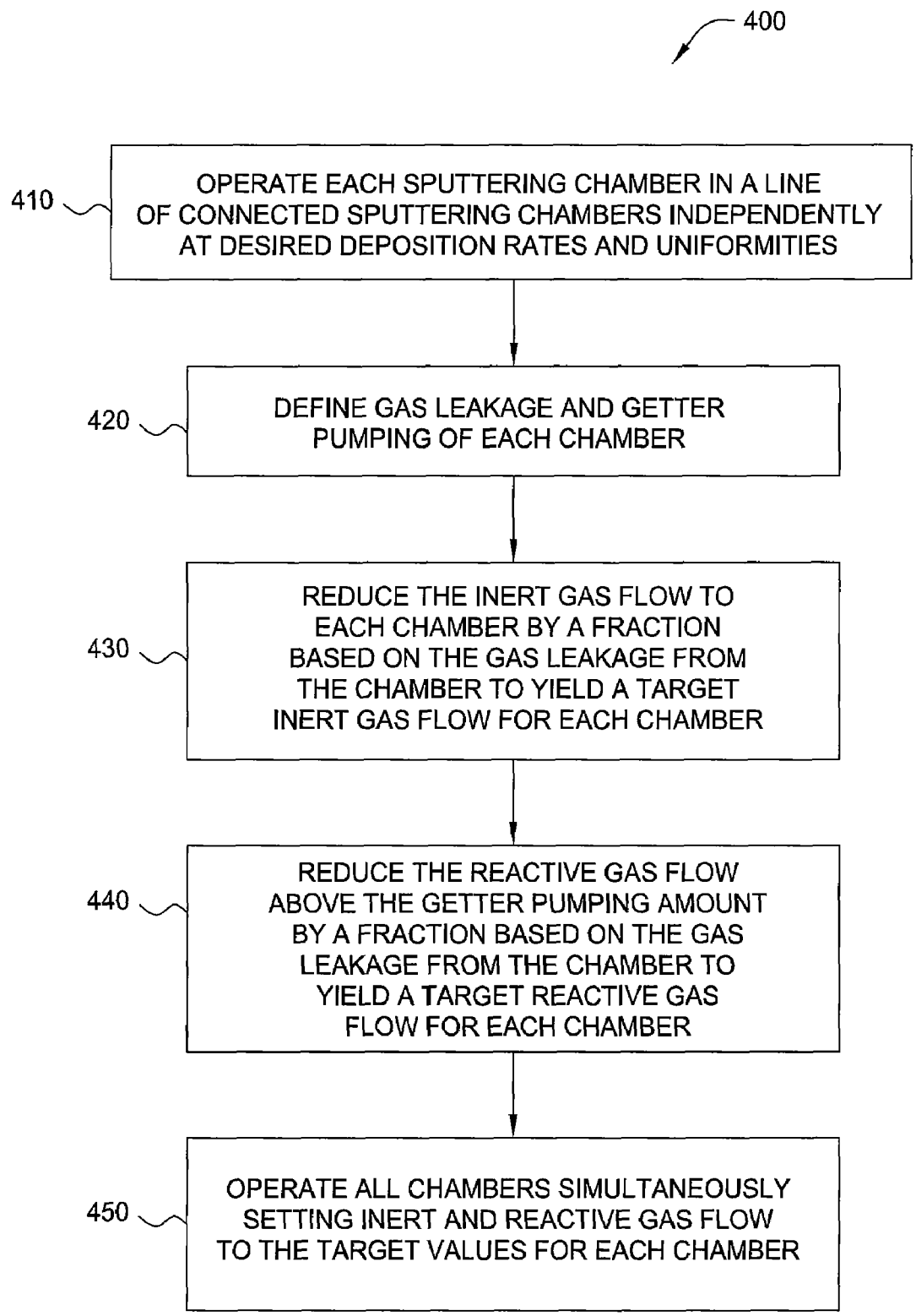
FIG. 4 is a flow diagram summarizing a method of operating a physical vapor deposition apparatus according to another embodiment.

FIG. 4 is a flow diagram summarizing a method 400 according to another embodiment of the invention. In the method 400, a line of connected sputtering chambers is operated in a startup mode to determine interactive effects between the chambers so that target gas flows may be set for desired deposition rate and uniformity in each chamber. At 410, each chamber in the line of connected sputtering chambers is operated independently at desired deposition rate and uniformity. In some embodiments, each chamber is operated alone, while the other chambers in the line are evacuated but remain idle. In other embodiments, multiple chambers in the line may be operated in startup mode, with any chamber adjacent to an operating chamber idle. In some embodiments, every third chamber may be operated in startup mode simultaneously. After one group of chambers is operated in startup mode, that group may be idled and another group operated in startup mode until all chambers in the line have been operated in startup mode. When operating in startup mode, it will usually be sufficient to maintain at least two idle chambers between operating chambers. In this way, startup time for the line may be reduced.

At 420, gas leakage and getter pumping rate of each chamber is determined, according to methods described above. At 430 and 440, gas flows to the operating chamber are reduced to account for gas leakage from adjacent chambers. When process gas is provided to the adjacent chambers, gas leaks from the adjacent chambers to the operating chamber and adds to the gas supplied locally to the operating chamber. Gas leakage into each chamber from adjacent chambers is subtracted from the gas feed to each chamber during startup operation so that the sputtering line achieves target operation more quickly. At 430, the inert gas flow to each chamber is reduced by a fraction based on the gas leakage from adjacent chambers. When the adjacent chambers are pressured, and gas leaks from them, this quantity of gas will no longer need to be provided. At 440, the amount of reactive gas flow above the getter pumping amount is also reduced by a similar fraction. The fractional reduction is generally proportional to the number of adjacent chambers and inversely proportional to the ratio of pressure in the operating chamber to pressure in one or more idle adjacent chambers, the ratio being indicative of the extent of leakage into the adjacent chambers.

At 450, all chambers are operated simultaneously at the target gas flow rates determined during the startup operations above. In general, the gas flow rates will be established, and then power applied to the target assemblies in each chamber so that pressure equilibrium is substantially maintained among the chambers. It is generally desirable to power all chambers approximately simultaneously to avoid a pressure drop in one chamber pulling gas from adjacent chambers and causing pressure fluctuations.

While the foregoing is directed to embodiments of the invention, other and further embodiments of the invention may be devised without departing from the basic scope thereof.

What is claimed is:

1. A method of operating a line of connected processing chambers, comprising:
    measuring gas isolation for each chamber in the line; measuring getter pumping flow for each chamber in the line; setting inert gas flow to each chamber based on its measured gas isolation; and setting reactive gas flow to each chamber based on its measured gas isolation and getter pumping flow, wherein measuring getter pumping flow for each chamber comprises operating the chamber independently and comparing a first pressure in the chamber being operated while applying power to the chamber being operated to a second pressure in the chamber being operated while power is off, and defining a getter pressure drop factor as a first ratio of the difference between the first and second pressures to the first pressure, and wherein setting reactive gas flow to each chamber based on its measured isolation and getter pumping flow further comprises defining a second ratio of an operating pressure of the chamber being operated to a pressure in an adjacent chamber, and reducing the reactive gas flow above the getter pumping flow rate by an amount inversely proportional to the second ratio.

2. The method of claim 1, wherein measuring gas isolation for each chamber comprises operating the chamber independently and comparing a first measured pressure in the chamber being operated with a second measured pressure in adjacent chambers.

3. The method of claim 2, wherein setting inert gas flow to each chamber based on its measured gas isolation comprises defining a gas isolation factor as a ratio of the first measured pressure to the second measured pressure.

4. The method of claim 3, wherein setting inert gas flow to each chamber based on its measured gas isolation further comprises reducing the inert gas flow by an amount inversely proportional to the gas isolation factor and proportional to the number of adjacent chambers.

* * * * *